United States Patent
Demange et al.

(10) Patent No.: US 9,462,728 B2
(45) Date of Patent: Oct. 4, 2016

(54) ELECTRONIC BOARD PROVIDED WITH A LIQUID COOLING SYSTEM

(71) Applicant: BULL SAS, Les Clayes-Sous-Bois (FR)

(72) Inventors: Fabien Demange, Poissy (FR); Luc Dallaserra, Paris (FR); Pascal Guilbault, Antony (FR)

(73) Assignee: BULL SAS, Les Clayes-sous-Bois (FR)

( * ) Notice: Subject to any disclaimer, the term of this patent is extended or adjusted under 35 U.S.C. 154(b) by 199 days.

(21) Appl. No.: 14/184,445

(22) Filed: Feb. 19, 2014

(65) Prior Publication Data
US 2014/0233175 A1    Aug. 21, 2014

(30) Foreign Application Priority Data

Feb. 20, 2013   (FR) ..................................... 13 51424

(51) Int. Cl.
*H05K 7/20*    (2006.01)
(52) U.S. Cl.
CPC ...... *H05K 7/20254* (2013.01); *H05K 7/20772* (2013.01)
(58) Field of Classification Search
CPC .................. H01L 23/473; H01L 2224/32225; H01L 2924/13091; H01L 2924/13055; H01L 2924/1305; H01L 2924/00; H05K 1/02; H05K 7/20; H05K 1/05; H05K 1/0272; H05K 1/20254
USPC ................................ 165/80.4, 170; 257/714
See application file for complete search history.

(56) References Cited

U.S. PATENT DOCUMENTS

| 4,155,402 | A  |   | 5/1979  | Just |   |
|---|---|---|---|---|---|
| 7,365,972 | B2 | * | 4/2008  | Chen | H01L 23/4006 165/185 |
| 7,508,668 | B2 | * | 3/2009  | Harada | H01L 25/072 361/689 |
| 7,965,340 | B2 | * | 6/2011  | Kurokawa | G02F 1/13452 348/580 |
| 8,059,405 | B2 | * | 11/2011 | Campbell | F28D 15/0266 165/104.33 |
| 8,149,579 | B2 | * | 4/2012  | Jadric | H05K 7/20936 165/80.4 |

(Continued)

FOREIGN PATENT DOCUMENTS

DE    40 12 100        10/1991
WO    WO 2009/143330   11/2009

OTHER PUBLICATIONS

Search Report and Written Opinion as issued for French Patent Application No. 1351424, dated Nov. 4, 2013.

*Primary Examiner* — Courtney Smith
*Assistant Examiner* — Matt Dhillon
(74) *Attorney, Agent, or Firm* — Pillsbury Winthrop Shaw Pittman LLP

(57) ABSTRACT

An electronic board includes a support on which first electronic components are installed, the first electronic components having a height of less than a first threshold height h1; a cold plate that extends parallel to the support, the distance between the cold plate and the support being equal to the first threshold height h1, the cold plate including a base plate in which at least one channel is formed through which a coolant can circulate, the base plate being fixed to a complementary plate closing the channel, the cold plate covers all first electronic components, the first electronic components being connected to the cold plate through deformable pads made of a heat conducting material.

7 Claims, 5 Drawing Sheets

(56) References Cited

U.S. PATENT DOCUMENTS

| | | | | |
|---|---|---|---|---|
| 8,159,819 B2* | 4/2012 | Memon | G06F 1/20 165/185 |
| 8,619,425 B2* | 12/2013 | Campbell | H05K 7/203 165/80.4 |
| 8,755,179 B2* | 6/2014 | Alyaser | F28D 15/00 165/104.33 |
| 8,867,210 B2* | 10/2014 | Harmelink | H05K 7/20254 165/104.33 |
| 8,953,317 B2* | 2/2015 | Campbell | H05K 7/203 165/104.33 |
| 8,953,320 B2* | 2/2015 | Campbell | H05K 7/20809 165/104.21 |
| 8,964,390 B2* | 2/2015 | Campbell | H05K 7/20809 361/679.53 |
| 8,971,038 B2* | 3/2015 | Sharaf | 165/104.33 |
| 9,095,942 B2* | 8/2015 | Campbell | H05K 7/203 |
| 9,210,830 B2* | 12/2015 | Campbell | H05K 7/20236 |
| 9,261,308 B2* | 2/2016 | Campbell | F28F 3/048 |
| 2004/0190255 A1 | 9/2004 | Cheon | |
| 2004/0223309 A1* | 11/2004 | Haemer | G01R 1/07314 361/767 |
| 2004/0246683 A1* | 12/2004 | Honsberg-Riedl | H05B 41/02 361/720 |
| 2007/0177356 A1* | 8/2007 | Panek | G06F 1/20 361/712 |
| 2007/0206361 A1 | 9/2007 | Cheng et al. | |
| 2013/0058038 A1* | 3/2013 | Alyaser | F28D 15/00 361/679.53 |
| 2013/0301328 A1* | 11/2013 | Ito | H05K 7/20254 363/141 |
| 2014/0146467 A1* | 5/2014 | Campbell | H05K 7/20236 361/679.53 |

\* cited by examiner

ELECTRONIC BOARD PROVIDED WITH A LIQUID COOLING SYSTEM

CROSS REFERENCES TO RELATED APPLICATIONS

This application claims priority to French Patent Application No, 1351424, filed Feb. 20, 2013, the entire content of which is incorporated herein by reference in its entirety.

FIELD

This invention relates to an electronic board provided with a liquid cooling system, particularly for a rackable server. This invention also relates to a rackable server in which such an electronic board is installed, and a rack comprising such a server.

BACKGROUND

Computer blades for a server usually contain electronic boards that release heat and therefore have to be cooled. These electronic boards were initially air-cooled. However, air circulation is not sufficient to cool electronic boards in the case of rackable servers.

Fluid cooling systems were developed to solve this problem. These cooling systems usually comprise one cold plate for each component to be cooled. Thus, cooling systems according to prior art contain a cold plate above each electronic component to be cooled, in other words a small plate usually made of copper with dimensions approximately equal to the dimensions of the component to be cooled and formed with channels inside which a coolant circulates. The different cold plates are usually connected to each other through copper channels inside which the coolant circulates from one cold plate to the next. However, such cooling systems are complex. Furthermore, copper tubes are usually fixed onto cold plates by brazing, and consequently there is a risk of leakage.

SUMMARY

An aspect of the invention is aimed at overcoming the disadvantages of the state-of-the-art by disclosing an electronic board cooling system, particularly for a rackable server, that is easy to install, compact and reliable, even when the electronic board comprises different sized electronic components.

To achieve this, a first aspect of the invention relates to an electronic board comprising:
- a support on which first electronic components, referred to as "low electronic components", are fixed, the first electronic components having a height of less than a first threshold height $h_1$;
- a cold plate that extends parallel to the support, the distance between the cold plate and the support being equal to the first threshold height $h_1$, the cold plate comprising a base plate in which at least one channel is formed through which a coolant can circulate, the base plate being fixed to a complementary plate closing the channel, the cold plate covering all first electronic components, the first electronic components being connected to the cold plate through deformable pads made of a heat conducting material.

Thus, the cooling system according to an embodiment of the invention is simpler than systems according to prior art because a single cold plate in which a channel is formed through which a coolant can circulate is capable of cooling not only all low electronic components, but also the entire support on which its components are located, which was not the case according to prior art. Furthermore, this cooling system is more reliable and the risk of leaks is limited because it does not require connectors between the different cold plates, and the channel is entirely contained in the cold plate. This cooling system is also more efficient because all electronic components (even the smallest) are cooled, although a special cold plate was not necessarily provided for them according to prior art. Furthermore, since the channel is formed in the cold plate, the geometry, dimensions and the density of the hydraulic network formed by the channel are chosen as a function of the heat released by the electronic components, as a function of the number and position of electronic components. Furthermore, cooling of electronic components is optimised due to the presence of deformable pads made of a heat conducting material, the thickness of which is one of the performance optimisation parameters.

The electronic board according to an embodiment of the invention may have one or several of the characteristics described below taken individually or in any technically possible combination.

In an embodiment, the cold plate has outside dimensions equal to or approximately equal to the support dimensions if through openings are ignored as will be seen later, so that the cold plate covers the entire support and therefore cools the entire support.

The electronic board may comprise different height electronic components. Thus, apart from low or first electronic components that have a height less than the first threshold height $h_1$, the electronic board may comprise second components referred to as "medium electronic components" fixed on the support with a height between the first threshold height $h_1$ and a second threshold height $h_2$ greater than $h_1$.

In this case, the cold plate is pierced by non-through openings inside which medium electronic components are inserted such that the cold plate covers all medium electronic components, the medium electronic components being connected to the cold plate through deformable pads made of a heat conducting material. These non-trough openings enable the cold plate to cover the medium electronic components so as to cool them.

In an embodiment, the thickness of the cold plate is equal to $h_2-h_1$.

The electronic board may also comprise third components referred to as "high electronic components", the high electronic components being fixed to the support, the high electronic components having a height greater than the second threshold height $h_2$.

In this case, the cold plate is pierced by through openings, in which high electronic components are inserted. These through openings make it possible to use a single cold plate that covers the entire support, except for the high electronic components. Furthermore, these through openings enable access to high electronic components, despite the presence of the cold plate, for example to replace them or to repair them.

High electronic components may be processors and/or memory modules.

The electronic board may also comprise additional heat dissipaters thermally connecting high electronic components and the cold plate so as to evacuate heat originating from high electronic components. Additional heat dissipaters may be connected to the cold plate through deformable pads made from a heat conducting material. Since the cold plate comprises through openings facing high electronic components, these high electronic components are not cooled by the cold plate directly, and consequently it is beneficial if additional heat dissipaters are used that thermally connect these high electronic components to the cold plate to evacuate heat from these high electronic components. In an embodiment, the additional heat dissipaters are made of copper.

In an embodiment, the electronic components are grouped on the support by size so as to simplify the design of the cold plate; an attempt is made especially to arrange them in groups if possible, with low electronic components together and medium electronic components together.

In an embodiment, the channel goes around through openings and/or non-through openings in the cold plate which facilitates manufacturing of the cold plate.

The distance between the support and the channel is constant, which facilitates manufacturing of the cold plate.

The cold plate is fixed onto the support such that the deformable pads are compressed between the electronic components and the cold plate. More precisely, the support extends along a reference plane, the cold plate extending parallel to this reference plane. When the support is not functioning and therefore no heat is released, the cold plate may be fixed onto the support such that pressure perpendicular to the reference plane is applied onto the deformable pads located between the electronic components and the cold plate. This pressure perpendicular to the reference plane compresses the deformable pads to assure that electronic components remain in thermal contact with the cold plate through the deformable pads, regardless of the dispersion on the height of components originating from manufacturing processes and deformation of the support. To achieve this, the deformable pads may be compressed to have a deformation of 20% to 50%. Furthermore, with such compression, the deformed shape of the support due to the pressure applied on the deformable pads is not too excessive and remains compatible with the mechanical strength of the support.

In an embodiment, the cold plate is fixed on the support by several attachment elements distributed over the entire cold plate so as to distribute forces over the entire cold plate and the entire support. Furthermore, the support comprises thermal drain zones formed by vias connecting internal ground planes of the support to heat conducting zones on the surface of the support and on which attachment elements of the cold plate to the support or deformable pads located between the support and the attachment elements of the cold plate to the support are fitted.

In an embodiment, the height of the deformable pads is between 1 mm and 5 mm, for example between 1.5 and 3 mm. A low height is chosen for deformable pads so as to optimise cooling of electronic components through the cold plate. Furthermore, the thickness of deformable pads is chosen so as to be able to adapt to variations in the height of electronic components. Thus, such a thickness for the pads makes it possible to tolerate height variations of electronic components of the order of +/−0.5 mm.

In an embodiment, the deformable pads are made of silicone gel with ceramic powder. Use of these materials gives good thermal conduction and provides sufficiently deformable pads without making the support dirty.

In an embodiment, the cold plate is made of aluminium.

In an embodiment, the base plate is hollowed out using a machining process to make the channel.

In an embodiment, the complementary plate is fixed to the base plate by a friction stir welding method, which gives a very strong and reliable attachment.

In an embodiment, the channel forms a hydraulic circuit that passes through the cold plate going around the through openings and the non-through openings. Cooling of the electronic board is more efficient when the channel is longer. The cold plate is provided with an inlet hydraulic coupling through which a coolant is injected into the channel and an outlet hydraulic coupling through which coolant is evacuated from the channel. The inlet hydraulic coupling and the outlet hydraulic coupling are located side by side on the same lateral face of the cold plate.

In an embodiment, the support is formed by one or several printed circuits. If the support is formed by several printed circuits, these printed circuits are located side by side in a single reference plane.

Each electronic board may also comprise one or several additional printed circuits. In this case, the cold plate is located between the support and the additional printed circuit(s).

The electronic board may also comprise an additional cold plate located between the first cold plate and the additional printed circuit(s). This second cold plate facilitates attachment of the additional printed circuit(s) on the first cold plate and facilitates heat transfer between the support and the additional printed circuit(s).

The additional cold plate may also comprise non-through openings and/or through openings when the additional printed circuit(s) is (are) fitted with electronic components with a height greater than the distance between the additional cold plate and the additional printed circuit(s).

A second aspect of the invention also concerns a computer blade comprising an electronic board according to the first aspect of the invention.

A third aspect of the invention relates to a rackable server comprising at least one computer blade according to the second aspect of the invention. Such a rackable server is very beneficial because the different computer blades can easily be disassembled with their cooling systems.

In an embodiment, the rackable server also comprises a hydraulic manifold to inject a coolant into the channel of each cold plate.

A fourth aspect of the invention also relates to a rack comprising at least one rackable server according to the third aspect of the invention.

The rack thus formed is very beneficial because the rackable servers can easily be disassembled with their cooling system. It is also compact.

In an embodiment, the rack comprises a main hydraulic manifold used to inject a coolant into the hydraulic manifolds of each server.

In an embodiment, the rack also comprises a pump to inject the coolant at a chosen flow in the different channels of the different computer blades.

BRIEF DESCRIPTION OF THE FIGURES

Other characteristics and benefits of the invention will become clear after reading the following detailed description given with reference to the appended figures that show.

For improved clarity, identical or similar elements are identified by identical reference symbols in all figures.

DETAILED DESCRIPTION

Figure 1:
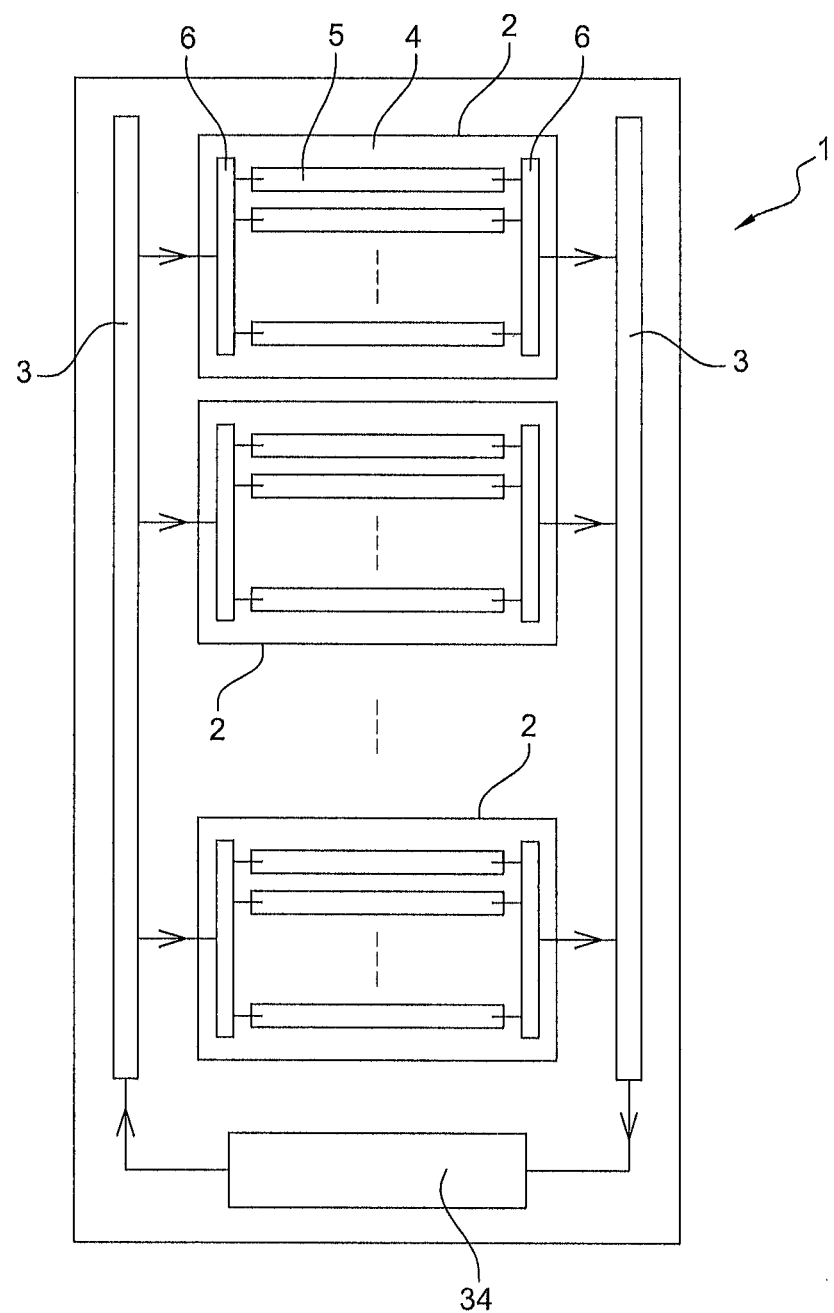
FIG. 1, a diagrammatic view of a rack according to an embodiment of the invention.

FIG. 1 shows a rack 1 according to an embodiment of the invention. This rack comprises rackable servers 2 that are removable from the rack 1, and can also be called a server chassis. The rack 1 also comprises a main hydraulic manifold 3 that is used to inject a coolant into the cooling systems of the rackable servers 1. The main hydraulic manifold 3 also distributes coolant between the different cooling systems of the different rackable servers 2. The rack 1 also comprises a device configured to inject and control the coolant 34, which in particular control the coolant circulation flow and temperature. The device configured to inject and control the coolant may also include a leak detection device or detector.

Figure 2:
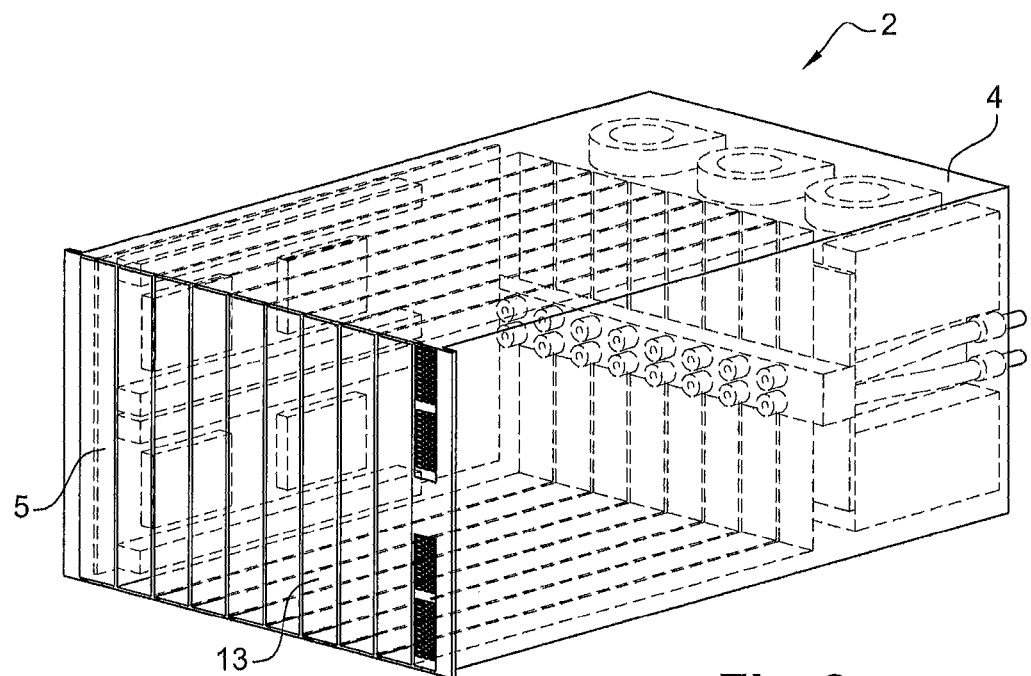
FIG. 2, a diagrammatic view of a rackable server according to an embodiment of the invention.

FIG. 2 shows a rackable server 2 according to an embodiment of the invention. This rackable server 2 comprises a chassis 4 inside which computer blades 5 are installed. One of these computer blades 5 is shown more precisely in FIGS. 3 to 5. Each rackable server 2 also comprises a hydraulic manifold 6 that distributes coolant between the cooling systems of the different computer blades 5 of the rackable server.

The computer blade 5 will now be described in more detail with reference to FIGS. 3 to 9. This computer blade 5 comprises a frame 13 enclosing the elements described in detail below. Thus, the computer blade 5 comprises an electronic board inside the frame 13.

This electronic board comprises a support 7. In an embodiment, this support 7 is formed by one or several printed circuits 8 placed side by side. Thus in this embodiment, the support 7 comprises two printed circuits 8a, 8b placed side by side. The support 7 extends along a reference plane 12 defined by a median plane of the support 7, the median plane extending parallel to the support 7. The two printed circuits 8a, 8b also extend along the reference plane 12.

The electronic board 5 also comprises electronic components 9, 10, 11 fixed on the support 7. The height of a component is its dimension along an axis perpendicular to the reference plane.

There can be three types of electronic components 9, 10, 11:

They may have a height h less than a first threshold height h1. In this case, these first electronic components are referred to as "low electronic components" 9;

They may have a height h between h1 and a second threshold height h2. In this case, these second electronic components are referred to as "medium electronic components" 10;

They may have a height h greater than or equal to the second threshold height h2. In this case, these third electronic components are referred to as "high electronic components" 11.

In this embodiment, the electronic board comprises particularly the following high electronic components:

two processors 11a, 11b fixed on each printed circuit 8a, 8b forming the support 7;

memory modules 11c, 11d fixed on each printed circuit 8a, 8b on each side of each processor 11a, 11b.

The electronic board 5 also comprises a cold plate 14 that cools the printed circuits 8a, 8b and the electronic components 9, 10, 11 when they are in operation. The cold plate 14 is shown more precisely in FIGS. 6 to 9. The cold plate 14 comprises:

a base plate 15 in which a channel 16 is formed that forms a hydraulic circuit through which a coolant can circulate;

a complementary plate 17 that is fixed to the base plate so as to close the channel 16.

The complementary plate 17 may be fixed on the base plate 15 by a friction stir welding process. However, the complementary plate 17 may be fixed by other attachment methods such as brazing or laser welding. The cold plate 14 may be made of aluminium.

The cold plate 14 also comprises an inlet hydraulic coupling 32 connected to a first end of the channel 16 and an outlet hydraulic coupling 33 connected to a second end of the channel 16. The inlet hydraulic coupling 32 and the outlet hydraulic coupling 33 may be on the same side 35 of the cold plate 14. The inlet hydraulic coupling and the outlet hydraulic coupling are connected to the hydraulic manifold 6 of the rackable server 2 to which the electronic board 5 belongs. They are used to inject coolant into the channel in the cold plate. To achieve this, the hydraulic manifold 6 is connected to the main hydraulic manifold 3 of the rack, which is itself connected to a device configured to inject and control the coolant 34, particularly to control the circulation flow and temperature of the coolant.

The cold plate 14 is fixed to the support 7. The first threshold height h1 is defined by the distance between the lower surface 19 of the cold plate 14 and the upper surface 20 of the support 7. The first height h1 is limited by the height of the frame 13 of the computer blade 5. The first height h1 may for example be equal to 3 mm. The second threshold height h2 is defined by the sum of the first threshold height h1 and the thickness of the cold plate 14. The second height h2 may for example be equal to 16 mm.

Figure 4:
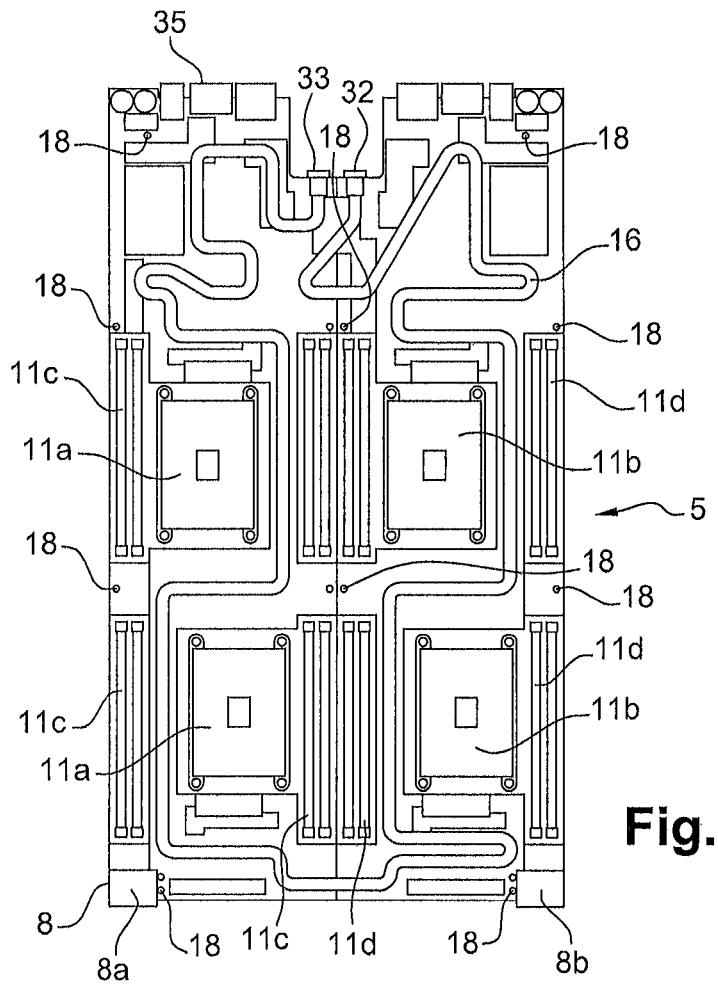
FIG. 4, a top view of the electronic board in FIG. 3.
Figure 5:
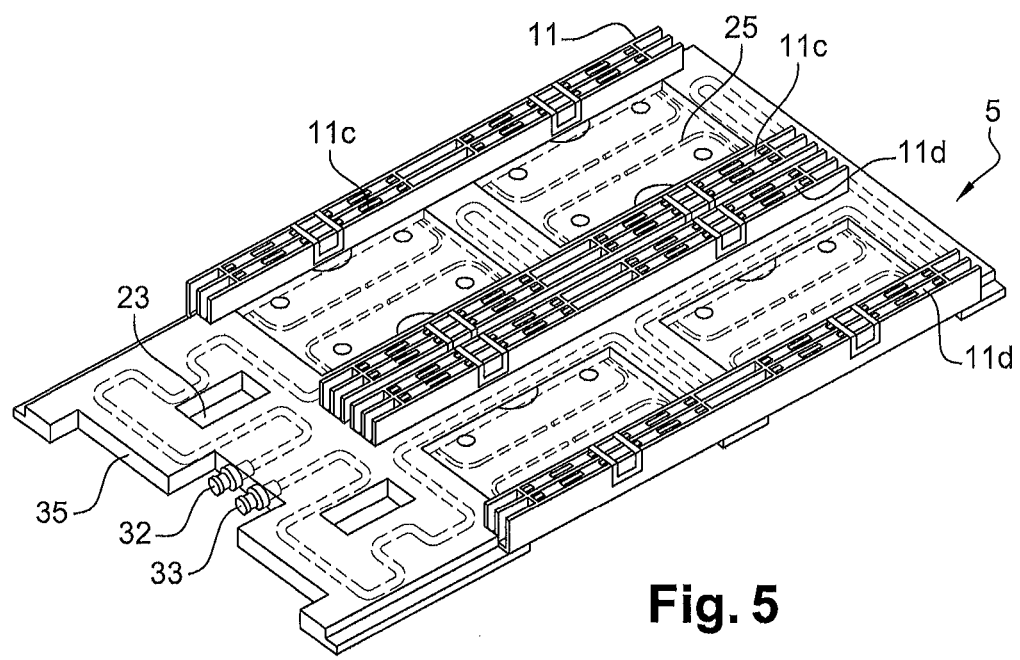
FIG. 5, a perspective view of part of the electronic board in FIG. 3.

The cold plate 14 has outside dimensions approximately equal to the dimensions of the support 7 as can be seen for example in FIG. 4, such that it covers the entire surface of the support 7 except for zones in which there are high electronic components as will be seen later.

Thus, the cold plate 14 covers all low electronic components 9. Furthermore, non-through openings 21 are made in the cold plate 14 above the medium electronic components 10 so that the cold plate also covers the medium electronic components 10.

The low electronic components 9 and the medium electronic components 10 are connected to the cold plate 14 through deformable pads 24 that are good heat conductors. The deformable pads 24 can improve removal of heat from electronic components through the cold plate, without making the electronic components or the support dirty. The thickness of the deformable pads may be as small as possible in order to optimise cooling of the electronic components. Furthermore, it is desirable that this thickness of the deformable pads be adaptable to the variation in height of electronic components, which is usually of the order of +/−0.5 mm. For these reasons, the deformable pads 24 may be between 1.5 and 3 mm thick. The deformable pads chosen will be of the "gap pad" type because:

they can be pre-assembled on the cold plate.
they allow several assembly/disassembly cycles without being replaced.
they are easily deformable and can compensate for the variation in height of the electronic components.
they do not pollute the support or its components and do not make them dirty.

Thus, in an embodiment, the deformable pads 24 are made from silicone gel with ceramic powder.

Furthermore, the cold plate 14 is fixed to the support 7 such that the deformable pads are compressed, by about 30% between the cold plate 14 and the electronic components 9, 10, along a direction perpendicular to the reference plane 12. This compression enables the deformable pads 24 to always remain in contact with the cold plate 14 and the components 9, 10 regardless of the variations in height of the electronic components and the fabrication tolerances. Thus, the deformable pads can guarantee good thermal contact between the cold plate and the electronic components to be cooled. However, it is desirable that the deformed shape of the support due to pressure applied by the deformable pads on the electronic components remain compatible with the mechanical strength of the support and not break the contact between other electronic components and the deformable pads.

The cold plate 14 is fixed to the support 7 through attachment elements 18. The function of attachment elements 18 is to control the deformed shape of the support for the reasons described above. To achieve this, the attachment elements 18 are distributed over the entire surface of the support 7, particularly so as to distribute forces applied to the support. They can also improve thermal contact between the cold plate and the support at the attachment elements. To achieve this, heat dissipation drains are provided in the support at the attachment points of the cold plate; these drains may bevias made in the support (electronic board) inserted under the cold plate attachment elements and/or under the deformable pads connecting the support to the cold plate so as to improve evacuation of heat from the support 7 through the cold plate 14.

Figure 6:
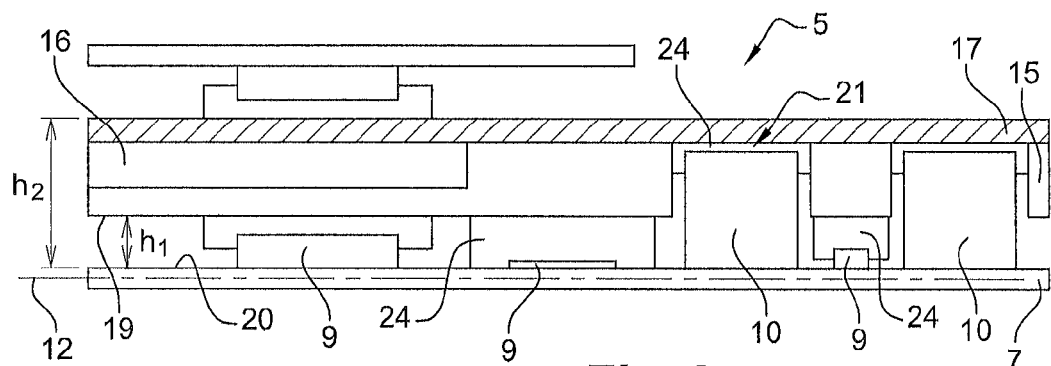
FIG. 6, a sectional view of the electronic board in FIG. 3.

Furthermore, as can be seen in FIG. 6, the channel 16 goes around the non-through openings 21, which simplifies fabrication of the cold plate. The channel thus has a constant cross-section and is contained within a two-dimensional plane. The section of the channel, its geometry and its path through the cold plate are chosen as a function of the electronic components to be cooled and the heat that they release. The channel may be located as close as possible to the inside surface 19 of the cold plate so that it is as close as possible to electronic components to optimise cooling of the components. It is desirable that the channel also pass above the electronic components that dissipate most heat.

Figure 3:
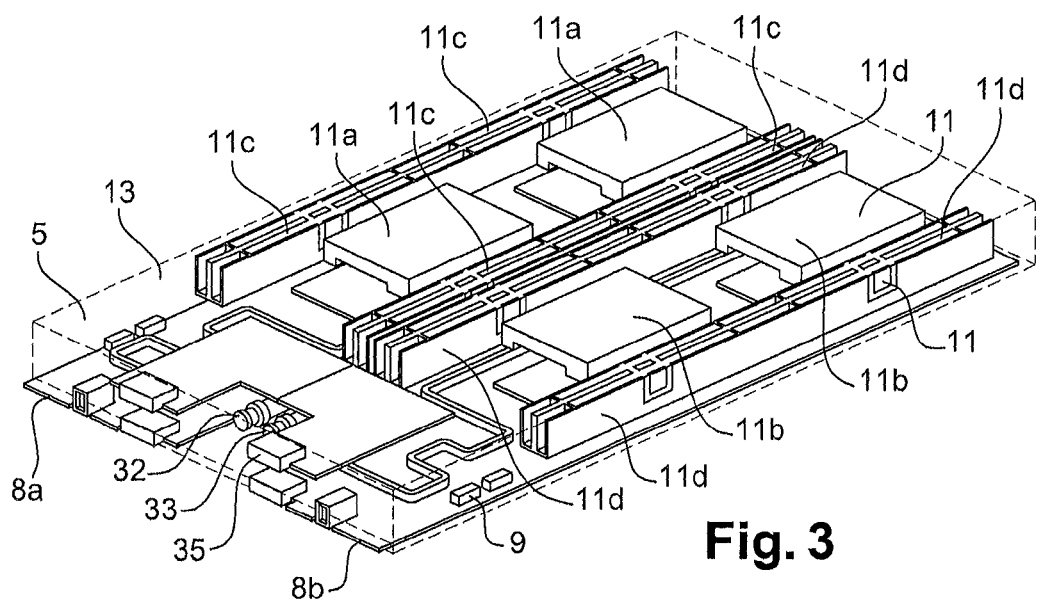
FIG. 3, a diagrammatic view of an electronic board according to an embodiment of the invention.
Figure 7:
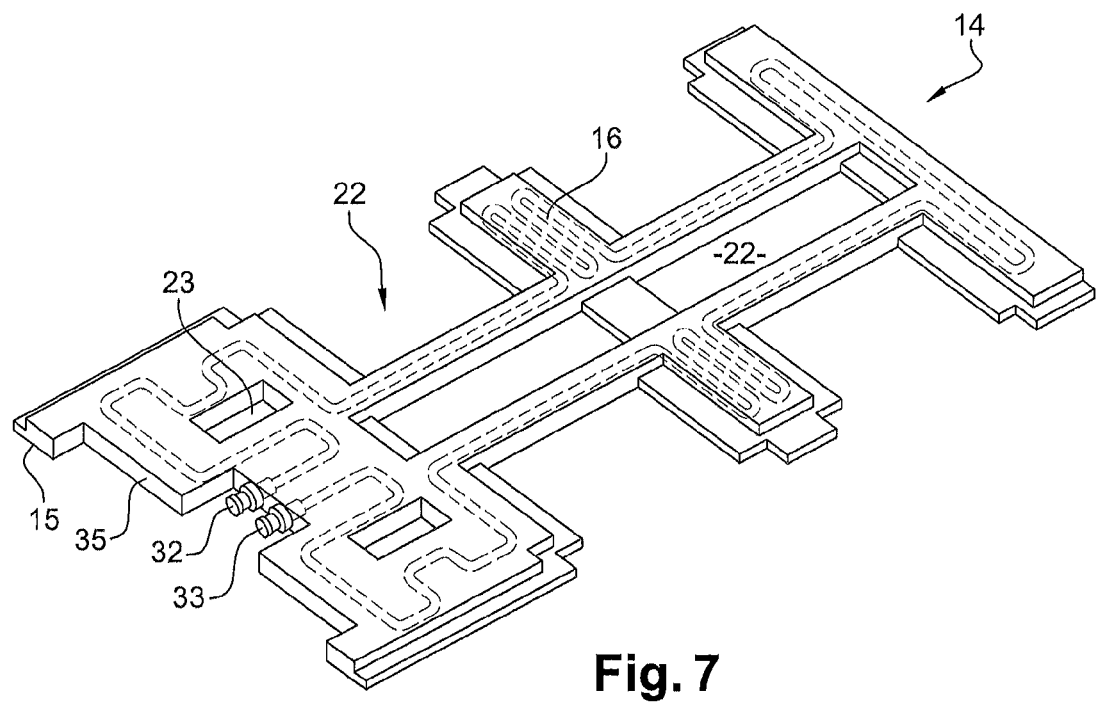
FIG. 7, a perspective view of a cold plate of an electronic board according to an embodiment of the invention.

Furthermore, through openings 22, 23 are made in the cold plate 14 at the high electronic components 11 such that the high electronic components pass through these through openings 22, 23 in the cold plate 14. Thus, as can be seen in FIG. 3, the high electronic components 11 in this embodiment are processors 11a, 11b, memory modules 11c, 11d and mezzanine connectors (not shown) and will be inserted into the through openings 23. The fact that through openings 22, 23 are formed in the cold plate 14 at the high electronic components enables access to the high electronic components 11 without needing to remove the cold plate 14, such that in particular they can be repaired or replaced. As can be seen in FIG. 7, the channel 16 also goes around the through openings 22, 23.

The high electronic components are not always sufficiently cooled by the cold plate and consequently, the electronic board may also include additional heat dissipaters 25 for example located between the support 7 and the high electronic component to be cooled. These additional heat dissipaters for example comprise heat conducting zones for example made of copper. The additional heat dissipaters 25 may be thermally connected to the cold plate 14. This thermal link may be made by attachment elements 18 between the cold plate and the support and by pads located at these attachment elements 18.

In an embodiment, electronic components are grouped by size in order to simplify manufacturing of the cold plate 14. According to an embodiment of the invention, preference is also given to low electronic components, firstly to maximise the number of components cooled by the cold plate and secondly to simplify the structure of the cold plate. Fewer openings will have to be made in the cold plate if there are fewer medium and high electronic components on the support.

Figure 8:
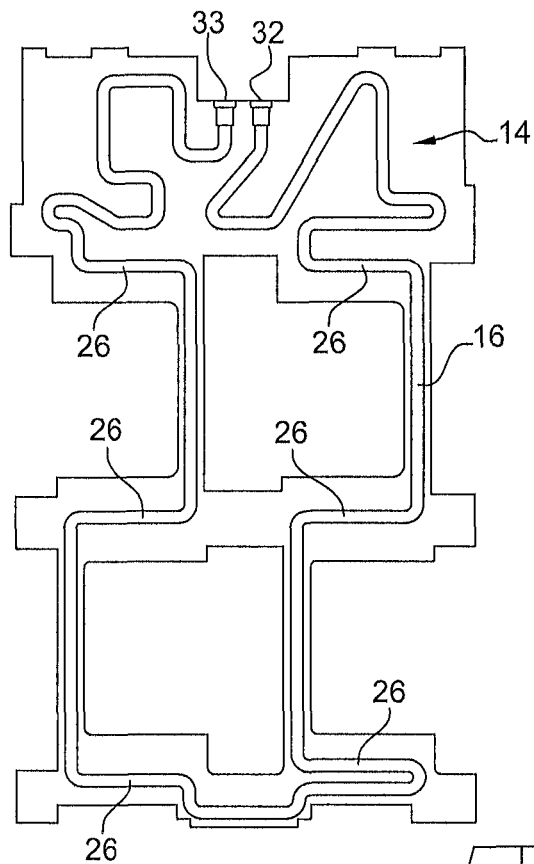
FIG. 8, a top view of the cold plate in FIG. 7.

FIG. 8 shows another embodiment in which the channel comprises turbulence zones 26 to create turbulence in the coolant so as to increase heat exchanges between the base plate 15 of the cold plate 14 and the coolant. These turbulence zones are formed by fins 27 that extend vertically into the channel 16.

Figure 9:
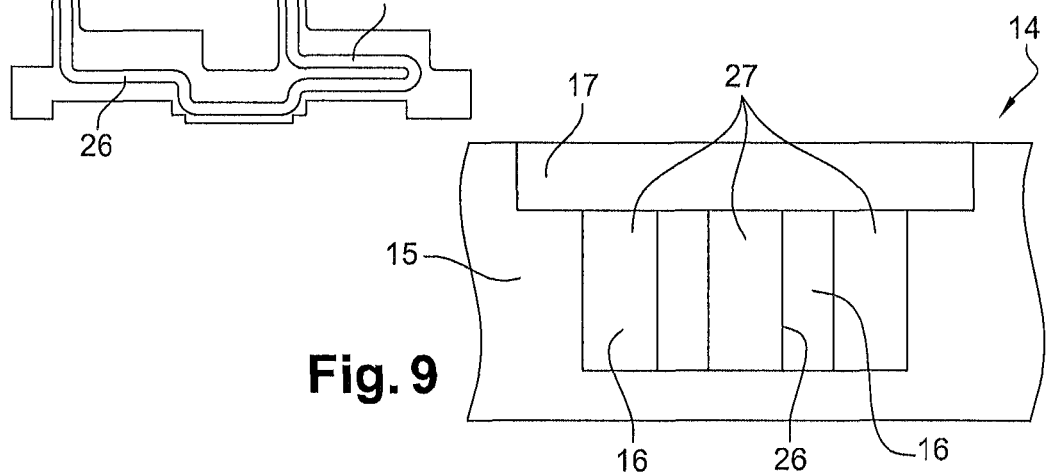
FIG. 9, a sectional view of a cross-section through part of the cold plate in FIG. 8.
Figure 10:
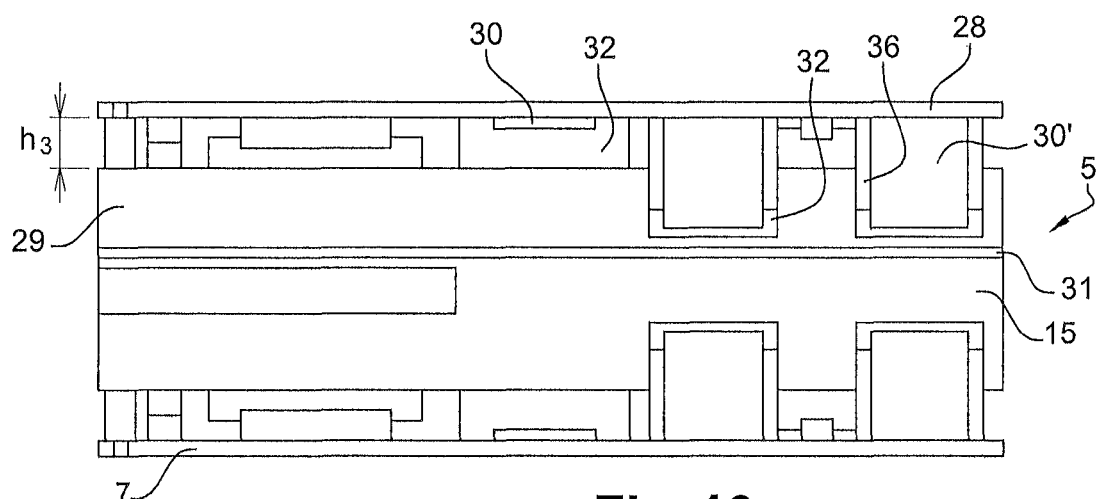
FIG. 10, a sectional view of an electronic board according to an embodiment of the invention.

FIG. 9 shows another embodiment in which the electronic board 5 also comprises an additional electronic circuit 28 that extends parallel to the support 7. Additional electronic components 30 may also be fixed on the additional electronic circuit 28. The electronic board 5 may also comprise an additional cold plate 29 inserted between the cold plate 14 and the additional electronic circuit 28. This additional cold plate 29 cools components 30 fixed onto the additional electronic circuit 28 and it also facilitates attachment of additional electronic circuit 28 and its electronic components 30 to the cold plate 14 despite the presence of the channel 16 in the cold plate 14. The additional cold plate 29 does not necessarily have a channel as shown in FIG. 29. The additional cold plate 29 is fixed onto the cold plate 14, through a thermal interface 31. The additional electronic components 30 may be fixed onto the additional cold plate 29 through the deformable heat conducting pads 32, which as explained above can evacuate heat released by the additional electronic components 30 to the additional cold plate 29, and also guarantee contact between the additional cold plate 29 and the additional thermal components 28. When the additional electronic components 30' are higher than the distance h3 between the additional cold plate 29 and the additional printed circuit 28, the additional cold plate 29 comprises non-through openings 26 into which the components 30' fit.

It will be appreciated that the invention is not limited to the embodiments disclosed with reference to the figures and variants could be envisaged without going outside the scope of the invention.

The invention claimed is:
1. An electronic board comprising;
a support on which first electronic components, second electronic components and third electronic components are fixed, the first electronic components having a height of less than a first threshold height, the second electronic components having a height between the first threshold height and a second threshold height greater than the first threshold height, and the third electronic components having a height greater than the second threshold height; and a cold plate that extends parallel to the support, the distance between the cold plate and the support being equal to the first threshold height, the cold plate comprising a base plate in which at least one channel is formed through which a coolant is able to circulate, the base plate being fixed to a complementary plate closing the channel, wherein the cold plate covers all the first electronic components, the first electronic components being connected to the cold plate through deformable pads made of a heat conducting material, wherein the cold plate is pierced by non-through openings inside which the second electronic components are inserted, the second electronic components being connected to the cold plate through deformable pads made of a heat conducting material, wherein the cold plate is pierced by through openings, in which the third electronic components are inserted, the electronic board further comprising additional heat dissipaters connecting the third electronic components and the cold plate.

2. The electronic board according to claim 1, wherein the cold plate has outside dimensions equal to the support dimensions.

3. The electronic board according to claim 1, wherein the channel goes around through openings and/or the non-through openings of the cold plate.

4. The electronic board according to claim 1, wherein a distance between the support and the channel is constant.

5. The electronic board according to claim 1, wherein the cold plate is fixed to the support such that the deformable pads are compressed between the electronic components and the cold plate.

6. The electronic board according to claim 1, further comprising one or several additional printed circuit boards, the cold plate being located between the support and the additional printed circuit(s), and an additional cold plate located between the cold plate and the additional printed circuit(s).

7. A rackable server comprising an electronic board according to claim 1.

* * * * *